_ _ _

United States Patent [19]

Yiu et al.

[11] Patent Number: 5,818,764
[45] Date of Patent: Oct. 6, 1998

[54] BLOCK-LEVEL WORDLINE ENABLEMENT TO REDUCE NEGATIVE WORDLINE STRESS

[75] Inventors: Tom D. Yiu, Milpitas, Calif.; I-Long Lee, I-Lan Hsian, Taiwan; Kuen-Long Chang, Taipei, Taiwan; Han-Sung Chen, Keelung, Taiwan; Tzeng-Huei Shiau, Hsin-Chu County, Taiwan; Chun-Hsiung Hung, Hsinchu, Taiwan; Ray-Lin Wan, Fremont, Calif.

[73] Assignee: Macronix International Co., Ltd., Hsinchu, Taiwan

[21] Appl. No.: 796,821

[22] Filed: Feb. 6, 1997

[51] Int. Cl.$^6$ .................................................. G11C 16/00
[52] U.S. Cl. ................................ 365/185.11; 365/185.29
[58] Field of Search ........................ 365/185.11, 185.29, 365/185.23, 185.18

[56] References Cited

U.S. PATENT DOCUMENTS

| | | | |
|---|---|---|---|
| 4,875,188 | 10/1989 | Jungroth | 365/185.22 |
| 5,050,125 | 9/1991 | Momodomi et al. | 365/185.17 |
| 5,065,364 | 11/1991 | Atwood et al. | 365/185.13 |
| 5,077,691 | 12/1991 | Haddad et al. | 365/218 |
| 5,091,888 | 2/1992 | Akaogi | 365/210 |
| 5,095,461 | 3/1992 | Miyakawa et al. | 365/185.14 |
| 5,117,394 | 5/1992 | Amin et al. | 365/203 |
| 5,142,496 | 8/1992 | Van Buskirk | 365/201 |
| 5,163,021 | 11/1992 | Mehrotra et al. | 365/185.03 |
| 5,185,718 | 2/1993 | Rinerson et al. | 365/189.01 |
| 5,197,034 | 3/1993 | Fandrich et al. | 365/227 |
| 5,212,663 | 5/1993 | Leong | 365/189.01 |
| 5,222,040 | 6/1993 | Chaiia | 365/185.24 |
| 5,235,544 | 8/1993 | Caywood | 365/185.26 |
| 5,280,454 | 1/1994 | Tanaka et al. | 365/185.11 |
| 5,282,170 | 1/1994 | Van Buskirk et al. | 365/226 |
| 5,287,536 | 2/1994 | Schreck et al. | 365/230.06 |
| 5,297,096 | 3/1994 | Terada et al. | 365/218 |
| 5,297,148 | 3/1994 | Harari et al. | 371/10.2 |
| 5,321,653 | 6/1994 | Suh et al. | 365/189.09 |
| 5,329,168 | 7/1994 | Sugibayashi et al. | 365/189.09 |
| 5,339,279 | 8/1994 | Toms et al. | 365/185.11 |
| 5,399,891 | 3/1995 | Yiu et al. | 257/316 |
| 5,412,238 | 5/1995 | Chang | 257/321 |
| 5,412,609 | 5/1995 | Ohtsuka et al. | 365/185.11 |
| 5,414,664 | 5/1995 | Lin et al. | 365/218 |
| 5,418,752 | 5/1995 | Harari et al. | 365/185.29 |
| 5,502,669 | 3/1996 | Saitoh | 365/185.29 |
| 5,528,546 | 6/1996 | Chao et al. | 365/185.21 |
| 5,532,960 | 7/1996 | Lin et al. | 365/185.29 |
| 5,646,890 | 7/1997 | Lee et al. | 365/185.29 |
| 5,679,224 | 10/1997 | Chevallier et al. | 365/185.23 |

FOREIGN PATENT DOCUMENTS

0525678A2  7/1992  European Pat. Off. ...... G11C 11/419

*Primary Examiner*—Tan T. Nguyen
*Attorney, Agent, or Firm*—Mark A. Haynes; Wilson, Sonsini, Goodrich & Rosati

[57] ABSTRACT

A circuit is provided for supplying a negative erasing voltage onto the wordlines of selected blocks in an array of floating gate memory cells. The circuit includes a voltage circuit, which has a plurality of local outputs, each of which connects to wordlines of an associated block of floating gate memory cells. A block selector circuit is coupled to the local outputs of the voltage circuit and selectively switches each of the local outputs to apply either an erasing voltage or a non-erasing voltage onto the wordlines of the associated block of floating gate memory cells. Negative wordline stress is thus reduced for wordlines of unselected blocks which receive a less negative, non-erasing voltage during block erase operations.

17 Claims, 8 Drawing Sheets

5,818,764

BLOCK-LEVEL WORDLINE ENABLEMENT TO REDUCE NEGATIVE WORDLINE STRESS

BACKGROUND

1. Field of the Invention

The present invention relates to the design of erasable and programmable non-volatile semi-conductor memory devices, and more particularly to circuits for erasing memory cells in FLASH EPROM devices which reduce wordline stress.

2. Related Art

FLASH memories are a popular form of non-volatile semiconductor storage. The memory cells in a FLASH memory array are formed using so-called floating gate transistors in which data is stored by charging or discharging the floating gate.

A FLASH memory is programmed by charging the floating gate. This is typically accomplished through hot electron injection, which is induced by establishing a large positive voltage between the gate and the source of the floating gate transistor, as much as 12 volts, and a positive voltage between the drain and source of the floating gate transistor, for example, 7 volts.

A FLASH memory cell is erased by discharging the floating gate. This discharging is typically accomplished through Fowler-Nordheim tunneling, which is induced by establishing a large positive voltage from the source to the gate of the floating gate transistor, while floating the drain. This positive voltage can be as much as 12 volts. However, applying 12 volts to the source and grounding the gate creates a very high reverse voltage between the source and the substrate. This increases the generation of hot holes, and the memory cell may exhibit "hot hole trapping." Hot hole trapping degrades endurance cycling performance of the floating gate memory cells.

In order to alleviate hot hole trapping during an erase operation, a large negative voltage, such as less than −7.5 volts, may be applied to the gate and a lower positive voltage may be applied to the source, for example, 7.0 volts. This generates much lower voltages between the source and the substrate, and hot hole generation is thereby suppressed.

However, FLASH memory is typically supplied with two external positive power sources rather than a negative power source. The first positive power source, $V_{DD}$, is applied at power up and is typically used during the read operation. $V_{DD}$ is usually 5.0±0.5 volts. The second positive power source, $D_{PP}$, is typically applied during program and erase mode, and is typically 12.0±0.6 volts. Therefore, in order to supply a negative voltage to the FLASH memory cells, a negative voltage is sometimes generated using an on-chip negative voltage charge pump. See U.S. Pat. No. 5,532,960, entitled, NEGATIVE VOLTAGE GENERATOR FOR FLASH EPROM DESIGN, by Lin et al., which is presently owned and was owned at the time of its invention by the same Assignee as the instant application, and is hereby incorporated by reference to disclose the details of negative voltage charge pump construction.

FLASH memories also suffer from the problem of over-erasure. Over-erasure occurs if, during the erasing step, too many electrons are removed from the floating gate, leaving a slight positive charge at the floating gate. This biases the memory cell slightly towards the on voltage, so that a small current may leak through the memory cell even when it is not addressed. A number of over-erased cells along a given bit line may cause an accumulation of leakage current sufficient to cause a false reading.

In order to deal with this over-erasure problem, FLASH memories have been organized into a plurality of blocks of memory cells, and the erasure operation has been structured so that only blocks which fail to erase are re-erased. See for example, U.S. Pat. No. 5,414,644, entitled FLASH EPROM WITH BLOCK ERASE FLAGS FOR OVER-ERASE PROTECTION, by Lin et al. This patent is currently owned and was owned at the time of its invention by the same Assignee as the instant application, and is hereby incorporated by reference for details on the structure of a block erase system for a FLASH memory.

Although the block erase structure disclosed in U.S. Pat. No. 5,414,644 alleviates some of the problems with over-erasure, it does not deal with the problem of negative wordline stress. Negative wordline stress occurs during an erasing operation when a negative voltage is applied to the wordlines of cells within blocks which are not selected for erasure. Erasure will generally not occur in cells within an unselected block in spite of the fact that a negative erasing voltage is applied to the wordlines of these unselected cells because no positive bias is applied to the source inputs of these cells. A negative erasing voltage on the gate input may nevertheless create negative wordline stress on the memory cell, causing loss of charge from the floating gate, which may give rise to subsequent reading errors.

What is needed is a system for applying an erasing voltage onto wordlines of selected blocks of floating gate memory cells during block erase operations, and a non-erasing voltage onto wordlines of unselected blocks of floating gate memory cells.

SUMMARY

The present invention reduces wordline stress in arrays of floating gate memory cells which support block-level erase operations. Wordline stress is reduced by applying a negative erasing voltage onto the wordlines of selected blocks of floating gate memory cells, and a less negative non-erasing voltage onto the wordlines of unselected blocks.

According to one embodiment of the present invention, the array of floating gate memory cells is organized into a plurality of blocks which can be selectively erased. Each of these blocks has an associated set of wordlines, which connect to the memory cells within the block. The invention includes a voltage circuit which has a plurality of local outputs, each of which connects to wordlines of an associated block of floating gate memory cells. A block selector circuit is coupled to the local outputs of the voltage circuit and selectively switches each of the local outputs to drive either an erasing voltage or a non-erasing voltage onto the wordlines of the associated block of floating gate memory cells.

According to one embodiment of the present invention, the erasing voltage is a negative voltage, and the non-erasing voltage is a negative voltage which is less negative than the erasing voltage.

According to another embodiment of the present invention, the erasing voltage is produced by an on-chip charge pump circuit.

According to yet another embodiment of the present invention, the above-mentioned voltage circuit comprises a global voltage circuit connected to a plurality of local voltage circuits, wherein each local voltage circuit is coupled to the wordlines of an associated block of floating memory cells. Each of the local voltage circuits further includes a plurality of p-channel transistors which function as pass gates and are coupled to the wordlines of the associated block, wherein the erasing voltage is selectively applied to the subset of wordlines through the plurality of p-channel transistors.

According to another embodiment of the present invention, the above-mentioned voltage circuit includes a global voltage circuit, which connects to a plurality of local voltage circuits, wherein each local voltage circuit is connected to the wordlines of an associated block of floating gate memory cells. The above-mentioned voltage circuit further includes a global enable charge pump which is distributed between the global voltage circuit and each of the plurality of local voltage circuits. This global voltage charge pump generates a second control voltage, which is a negative voltage used to gate the non-erasing voltage onto the wordlines of the associated block. Each local voltage circuit includes a local enable charge pump, which generates a first control voltage, which is a negative voltage used to gate the erasing voltage onto the wordlines of the associated block. This local enable charge pump is coupled to, and is enabled by, a block selector circuit. Each local voltage circuit also includes a local output from the global enable charge pump. The local output of the global enable charge pump, and the output of the local enable charge pump are coupled together to form a wordline enable signal. This wordline enable signal feeds into the gate inputs of a plurality of p-channel transistors through which the erasing voltage connects to the wordlines of an associated block of floating gate memory cells.

When the local enable charge pump is enabled, the wordlines are driven by both the global enable charge pump and the local enable charge pump, creating a voltage which is more negative than the erasing voltage. This voltage feeds into the gate inputs of the p-channel transistors, allowing the erasing voltage to pass through the plurality of p-channel transistors and into the wordlines of the associated block of floating gate memory cells.

When the local enable charge pump is not enabled, the wordline enable is driven by the global enable charge pump only, and not the local enable charge pump. This causes the voltage on the gate inputs of the plurality of p-channel transistors to be less negative than the erasing voltage. This allows a non-erasing voltage, which is less negative than the erasing voltage, to pass through the plurality of p-channel transistors into the wordlines of the associated block of floating gate memory cells.

Other aspects and advantages of the present invention can be seen upon review of the figures, the detailed description and the claims which follow.

DESCRIPTION

The following description is presented to enable any person skilled in the art to make and use the invention, and is provided in the context of a particular application and its requirements. Various modifications to the preferred embodiment will be readily apparent to those skilled in the art, and the general principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1:
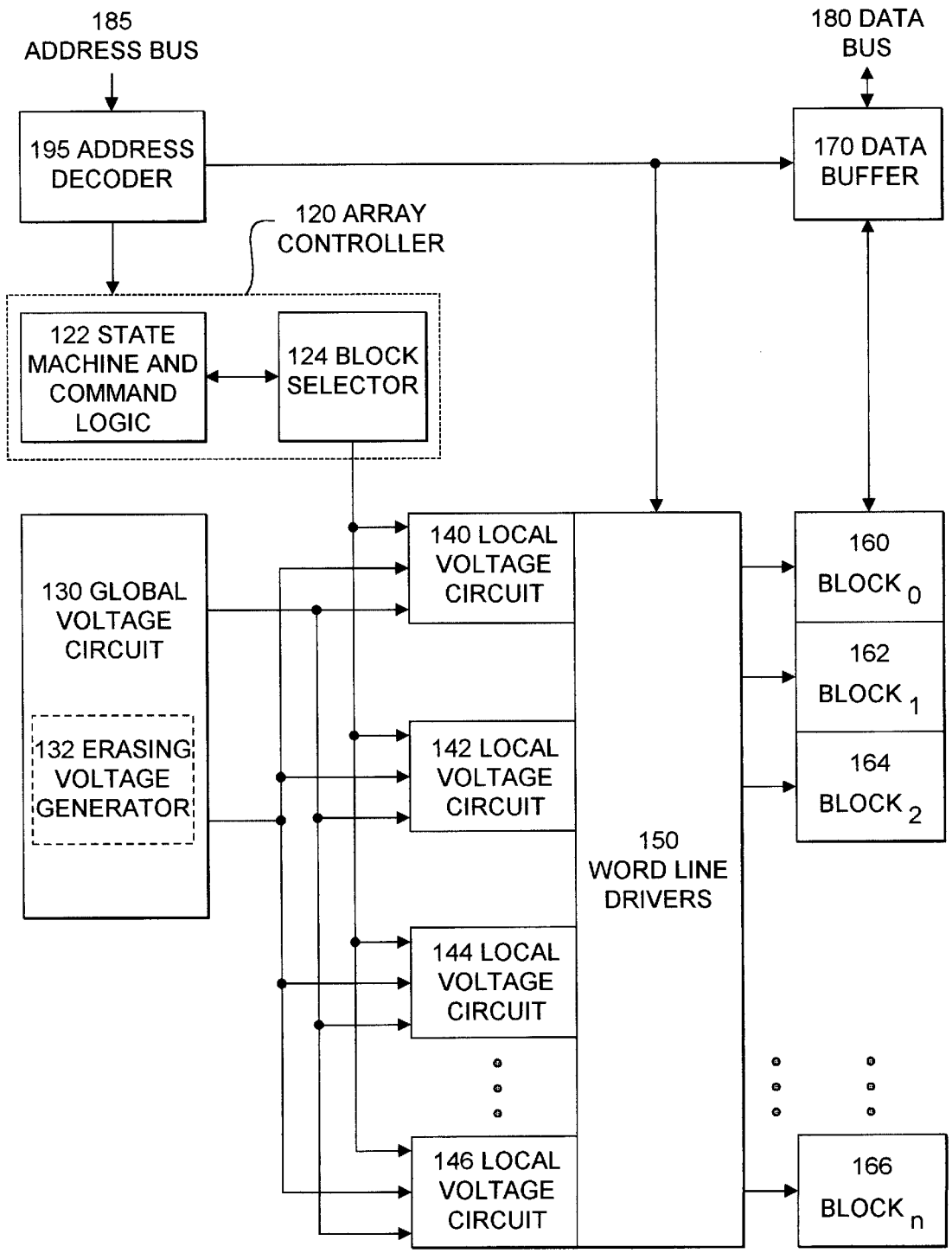
FIG. 1 is a block diagram of the major functional components of a system for applying an erasing voltage onto the wordlines of a selected block of floating gate memory cells in accordance with an aspect of the present invention.

FIG. 1 is a block diagram of the basic structure of a system for selectively applying an erasing voltage onto the wordlines of selected blocks in an array of floating gate memory cells in accordance with an aspect of the present invention. The array of floating gate memory cells generally includes a plurality of blocks of floating gate memory cells, $Block_0$ 160, $Block_1$ 162, $Block_2$ 164, . . . , $Block_n$ 166. The wordlines of these blocks connect to Wordline Drivers 150.

More specifically, Wordline Drivers 150 connect to: $Block_0$ 160, $Block_1$ 162, $Block_2$ 164 and $Block_n$ 166. Data is written into and read from the blocks of floating gate memory cells from Data Buffer 170. Data Buffer 170 itself receives data from and transmits data across Data Bus 180, which connects the array floating gate memory cells to an external central processing unit (CPU), or, alternatively, another type of bus-controlling device such as a direct memory access (DMA) controller.

The circuitry for applying the erasing voltage onto the wordlines of blocks of floating gate memory cells includes Global Voltage Circuit 130, which connects to a plurality of local voltage circuits including Local Voltage Circuits 140, 142, 144 and 146. Local Voltage Circuits 140, 142, 144 and 146 connect to Wordline Drivers 150, which directly drive the wordlines of the blocks of floating gate memory cells. Global Voltage Circuit 130 includes Erasing Voltage Generator 132, which connects to, and applies an erasing voltage to, Local Voltage Circuits 140, 142, 144 and 146.

Global Voltage Circuit 130 and Local Voltage Circuits 140, 142, 144 and 146, are controlled by portions of Array Controller 120. Array Controller 120 includes a State Machine and Command Logic portion 122 as well as Block Selector 124. State Machine and Command Logic portion 122 takes inputs from Address Decoder 190, which itself takes inputs from Address Bus 185. State Machine and Command Logic portion 122 additionally connects to Block Selector 124 and Global Voltage Circuit 130. Block Selector 124 additionally connects to each of Local Voltage Circuits 140, 142, 144 and 146.

State Machine and Command Logic portion controls the 122 erasing process by outputting sequences of commands to Global Voltage Circuit 130 and to Block Selector 124. These sequences of commands cause erasing voltages to be driven onto the wordlines of selected blocks of floating gate memory cells, and non-erasing voltages to be driven onto the wordlines of unselected blocks of floating gate memory cells.

Figure 2:
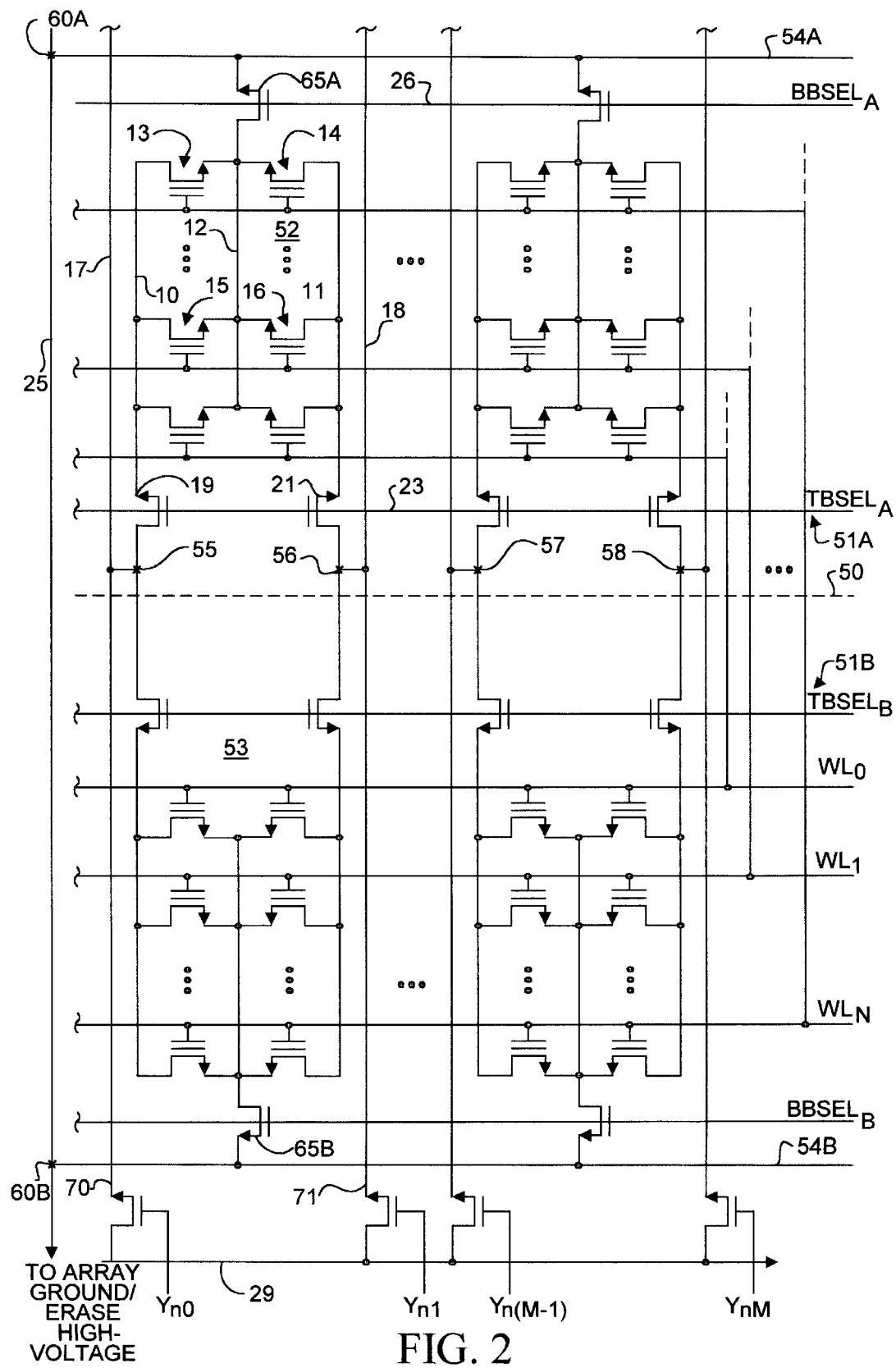
FIG. 2 is a circuit diagram showing an array of floating gate memory cells in accordance with an aspect of the present invention.

FIG. 2 illustrates a segmentable array architecture, using a drain-source-drain configuration of the FLASH EPROM circuit, as described in U.S. Pat. No. 5,414,664, entitled FLASH EPROM WITH BLOCK ARRAY FLAGS FOR OVER-ERASE PROTECTION, which is now owned and at the time of its invention by the same Assignee as the present application. This patent is hereby incorporated by reference. The circuit includes a first local bitline 10 and a second local bitline 11. The first and second local bitlines, 10 and 11, are implemented using buried diffusion conductors. Also, included is a local virtual ground line 12 implemented by buried diffusion. A plurality of floating gate transistors having gates, drains and sources are coupled to the local bitlines 10 and 11 and to virtual ground line 12. The sources of the plurality transistors are coupled to the local virtual ground line 12. The drains of a first column of transistors, generally 13, are coupled to the first local bitline 10, and the drains of a second column of transistors, generally 14, are coupled to the second local bitline 11. The gates of the floating gate transistors are coupled to wordlines $WL_0$ through $WL_N$, where each wordline (e.g., $WL_1$) is coupled to the gate of a transistor (e.g., transistor 15) in the first local bitline 10, and a transistor (e.g., transistor 16) in the second local bitline 11. Thus, transistors 15 and 16 can be considered a two transistor cell with a shared source diffusion.

The act of charging the floating gate is called the "program step" for the FLASH EPROM cell. This is accomplished on a byte by byte basis through hot electron injection by establishing a large positive voltage between the gate and the source, such as twelve volts, and a positive voltage between the drain and the source, such as six volts.

A first global bitline 17 and a second global bitline 18 are associated with each drain-source-drain block. The first global bitline 17 is coupled to the source of top block select transistor 19 through a metal-to-diffusion contact 55. Similarly, the second global bitline 18 is coupled to the source of top block select transistor 21 through a metal-to-diffusion contact 56. The drains of the top block select transistors 19, 21 are coupled to the first and second local bitlines 10 and 11, respectively. The gates of the top block selector transistors, 19 and 21, are controlled by a top block select signal $TBSEL_A$ on line 23.

The local virtual ground line 12 is coupled to a virtual ground terminal across conductor 54A through bottom block selector transistor 65A. The drain of the bottom block select transistor 65A is coupled to the local virtual ground line 12. The source of the bottom block select transistor 65A is coupled to the conductor 54A. The gate of the bottom block select transistor 65A is controlled by a bottom block select signal $BBSEL_A$ across line 26. In the preferred system, the conductor 54A is a buried diffusion conductor which extends to a metal-to-diffusion contact 60A at a position displaced horizontally through the array, which provides contact to a vertical metal virtual ground bus 25.

The global bitlines extend vertically through the array to respective column select transistors 70 and 71, through which a selected global bit line is coupled to a sense amplifier and program data circuitry (not shown). Thus, the source of column select transistor 70 is coupled to global bitline 17, the gate of column select transistor 70 is coupled to column decode signal $Y_{n0}$, and the drain of the column select transistor 70 is coupled to conductor 29.

The blocks of FLASH EPROM cells as shown in FIG. 1 are configured into a plurality of subarrays as illustrated in FIG. 2. FIG. 2 illustrates two subarrays within a larger integrated circuit. The subarrays are divided generally along dotted line 50 and include subarray 51A, generally above the line 50, and subarray 51B, generally below the line 50. A first group 52 of cells is laid out in a mirror image with a second group 53 of cells along a given bit line pair (e.g., bitlines 17 and 18). As one proceeds up the bitline pair, the memory subarrays are flipped so as to share virtual ground conductors 54A and 54B (buried diffusion) and metal-to-diffusion contacts 55, 56, 57 and 58. The virtual ground conductors 54A and 54B extend horizontally across the array to a vertical virtual ground metal line 25 through metal-to-diffusion contacts 60A and 60B. The subarrays repeat on opposite sides of the metal virtual ground line 25 so that adjacent subarrays share a metal virtual ground line 25. The metal virtual ground line 25 is coupled to array ground and erase high-voltage circuitry. Thus, the subarray layout requires two metal contact pitches per column of two transistor cells for the global bitlines and one metal contact pitch per subarray for the metal virtual ground line 25.

Furthermore, two or more subarrays as illustrated in FIG. 2 may share wordline signals as illustrated because of the additional decoding provided by the top and bottom block select signals TBSELhd A, $TBSEL_B$, $BBSEL_A$, and $BBSEL_B$. In the preferred system, each block is configured to include four subarrays in a column, a row in each subarray, sharing a common wordline driver with rows in the other three subarrays. Decoding amongst the four subarrays is executed using the top block select transistors in response to $TBSEL_A$ and $TBSEL_B$. Each subarray includes 32 wordlines and 1K (1,024) bitlines. Thus, with four subarrays, 32 wordlines deep, and 1K bitlines wide, a block of 128K cells is provided. Thirty-two blocks make a 4 megabit memory.

Figure 3:
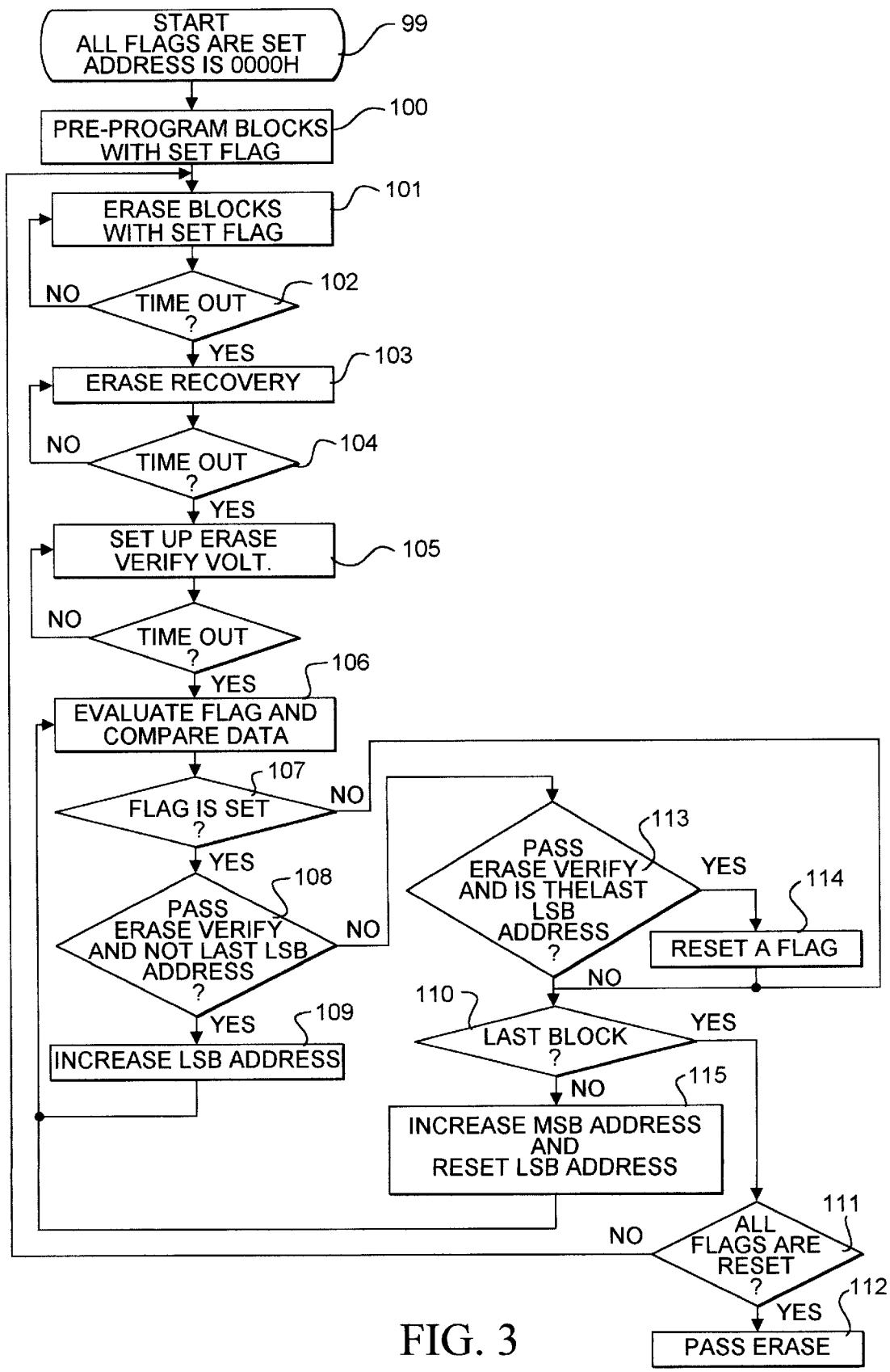
FIG. 3 is a flowchart showing the sequence of steps in the erase operation and the erase verify operation in accordance with an aspect of the present invention.

FIG. 3 illustrates the algorithm for embedded erase which is executed by State Machine and Command Logic portion 122 within Array Controller 120. State Machine and Command Logic portion 122 includes a plurality of block erase flags, which indicate whether an associated block is to be erased, and an address counter, which holds addresses of bytes of floating gate memory cells.

An erase operation begins at block 99 with the setting of one or more flags. For a chip erase, all flags are set and the address counters are initialized to address 0. If a block erase operation is to be executed, only the flags for selected blocks are set. Next, a pre-program operation is executed on selected blocks (block 100).

In the next step, all the blocks having a set flag are erased (block 101).

Then the entire set of selected blocks is erased by applying energizing voltages as described above segmented under control of the bottom block select transmitter.

A timer waits for an erase timeout condition (block 102). After the timeout condition, an erase recovery phase is entered (block 103). Again, this recovery phase is timed as indicated at block 104.

After erase recovery, the erase verify voltages are set up (block 105). This operation is described in detail in our previous patent application entitled ERASE AND PROGRAM VERIFICATION CIRCUIT FOR NON-VOLATILE MEMORY, by inventors Liang Chao, Tien-Ler Lin and Tom D. Yiu. This previous patent application is owned and at the time of its invention by the same Assignee as the instant application.

The next step is to evaluate the flag and compare the data in each location inside the blocks having a set flag (block 106). This involves determining whether the flag is set (block 107). If it is set, the routine checks first for an erase verify pass and overflow of the least significant bit counter (block 108). If a pass is detected and the counter is not at the end of the block, then the least significant bit address is incremented (block 109). At this point, the algorithm loops back to block 106.

If the flag is not set, then the algorithm loops to block 110 where it tests to determine where the last block has been tested. If it has been tested, then the algorithm loops to block 111 to determine whether all flags have been reset. If all have been reset, or are in a reset state at the beginning of the routine, then the algorithm indicates that the erase is done (block 112). If all flags have not been reset, then the algorithm loops back to block 101 to re-erase blocks having a set flag.

If, at block 108, a cell did not pass erase verify or passes but is the last LSB in the block, then the algorithm branches to block 113. In block 113, the algorithm again tests for erase verify pass and the end of the block. If the cell is at the end of the block and passes, then the flag for the block is reset (block 114). If the cell is not at the end of the block or a cell has an erase verify fail, then the algorithm branches to block 110 where it tests to determine whether the last block has been checked. If the last block has not been checked, then the MSB address is incremented to go to the next block, and the LSB address is reset (block 115). At that point, the algorithm loops back to block 106 to loop through other blocks having a set flag for erase verify.

In the preferred system, this control loop shown in FIG. 3 is implemented using a state machine and timer to time program, program verify, erase and erase verify operations coupled to the address counter and the block erase flags inside State Machine and Command Logic portion 122.

Figure 4:
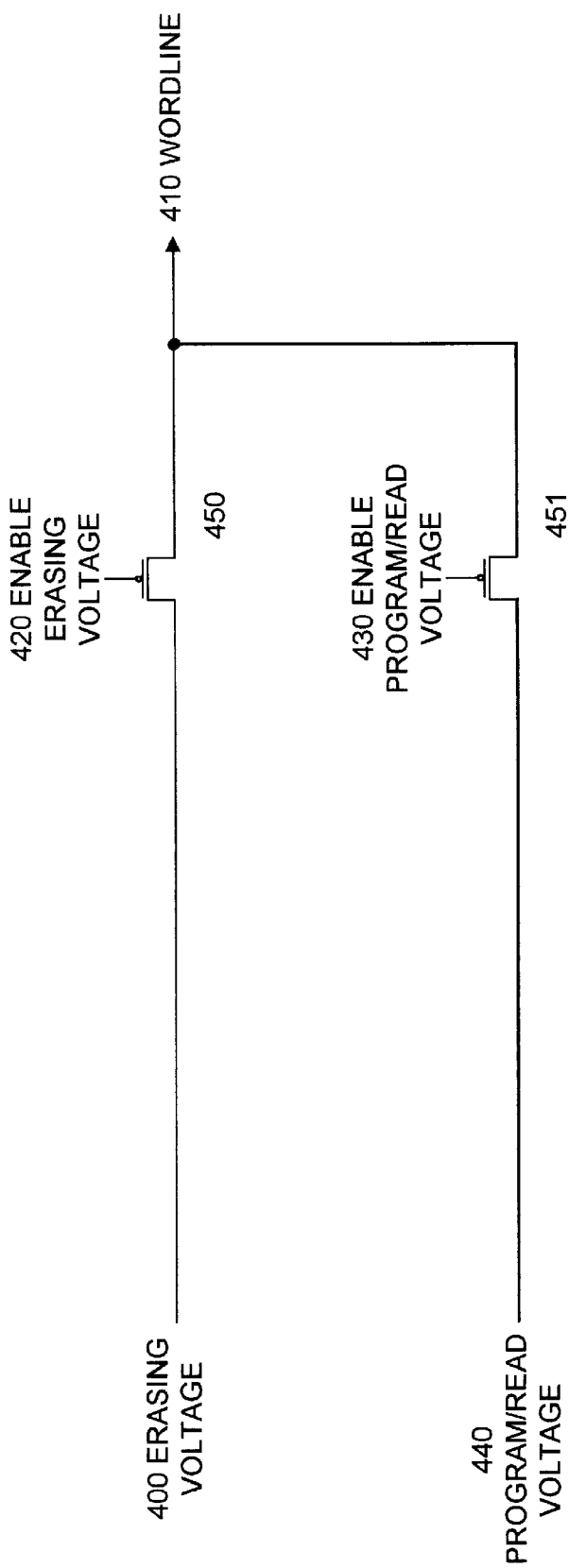
FIG. 4 is a circuit diagram showing how the erasing voltage and the program and read voltages are connected to, and are selectively applied to, a wordline in accordance with an aspect of the present invention.

FIG. 4 is a circuit diagram illustrating how a single Wordline 410 is connected to both an Erasing Voltage 400 and a Program/Read Voltage 440. Erasing Voltage 400 passes through p-channel transistor 450 and connects to Wordline 410. Enable Erasing Voltage signal 420 connects to the gate input of p-channel transistor 450. Program/Read Voltage signal 440 passes through p-channel transistor 451 and connects to Wordline 410. Enable Program/Read Voltage signal 430 connects to the gate input of p-channel transistor 451.

Erasing Voltage 400 and Program/Read Voltage 440 are alternately driven onto Wordline 410. Array Controller 120 ensures that Erasing Voltage 400 and Program/Read Voltage 440 are not driven onto Wordline 410 at the same time. When Enable Erasing Voltage signal 420 assumes a voltage lower than Erasing Voltage 400, Erasing Voltage 400 passes freely through p-channel transistor 450 onto Wordline 410. When Enable Program/Read Voltage signal 430 assumes a voltage lower than Program/Read Voltage 440, Program/Read Voltage 440 is driven onto Wordline 410.

Figure 5:
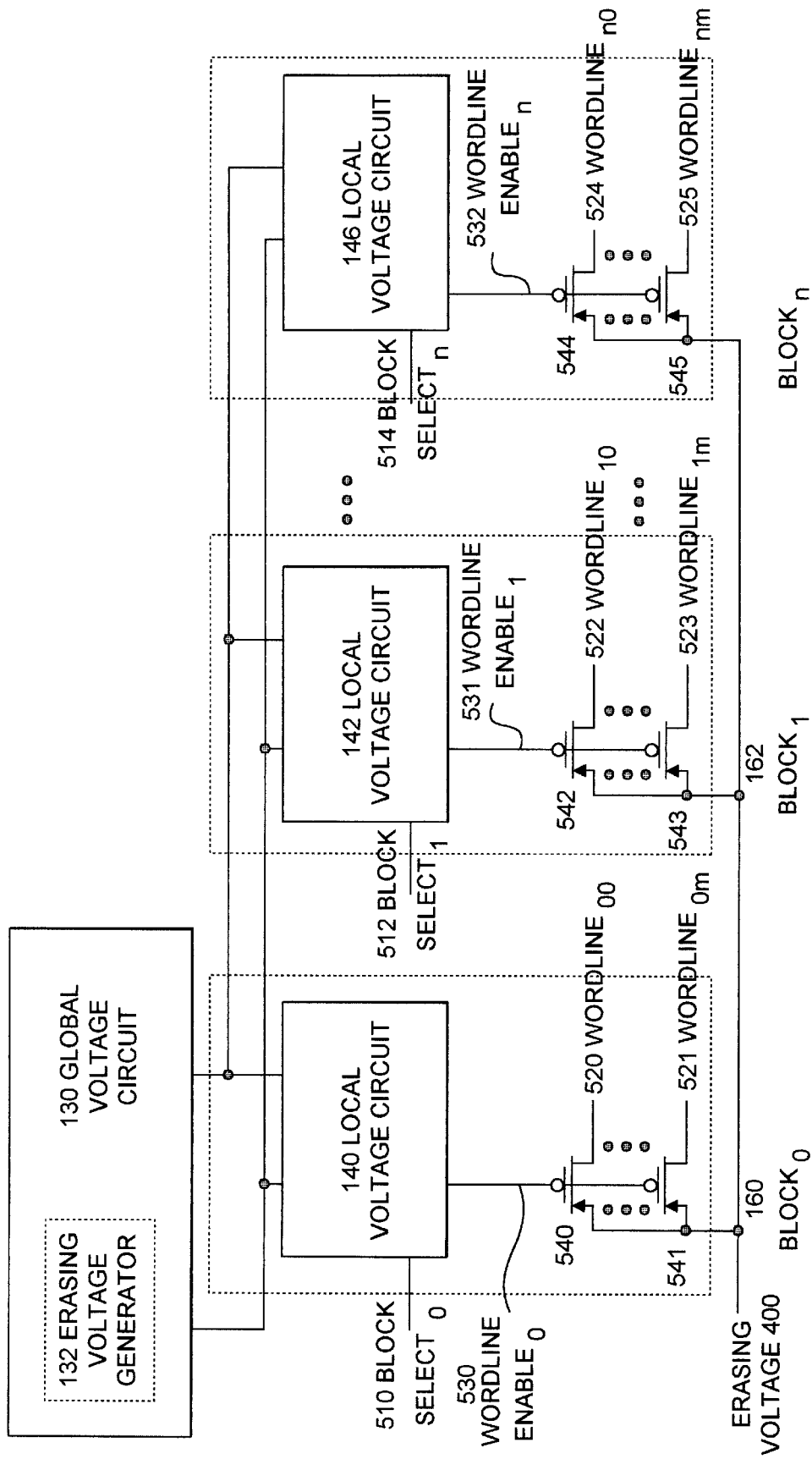
FIG. 5 is a diagram illustrating how Erasing Voltage 400 is applied to wordlines of selected blocks of floating gate memory cells in accordance with an aspect of the present invention.

FIG. 5 is a diagram illustrating how Erasing Voltage 400 is applied to wordlines of selected blocks of floating gate memory cells in accordance with an embodiment of the present invention. The array of floating gate memory cells is divided into a plurality of blocks, including: $Block_0$ 160, $Block_1$ 162 and $Block_n$ 166. Global Voltage Circuit 130 connects to each of Local Voltage Circuits 140, 142 and 146, which are coupled to $Block_0$ 160, $Block_1$ 162 and $Block_n$ 166, respectively. Global Voltage Circuit 130 further includes Erasing Voltage Generator 132, which connects to and provides Erasing Voltage 400 to Local Voltage Circuits 140, 142 and 146. The output of Erasing Voltage Generator 132 connects to through Local Voltage Circuits 140, 142, . . . , and 146.

Each local voltage circuit also takes in a block select input, for selectively enabling the wordlines of its associated block of floating gate memory cells. More specifically, Local Voltage Circuit 140 takes in $Block\ Select_0$ signal 510; Local Voltage Circuit 142 takes in $Block\ Select_1$ signal 512; and Local Voltage Circuit 146 takes in $Block\ Select_n$ signal 514.

Local Voltage Circuits 140, 142 and 146 selectively enable a set of p-channel transistors through which Erasing Voltage 400 is driven onto the wordlines of associated blocks floating gate memory cells. In particular, Local Voltage Circuit 140 generates $Wordline\ Enable_0$ 530, which is applied to the gate inputs of p-channel transistors 540 and 541 as well as a number of intervening p-channel transistors. Erasing Voltage 400 passes through p-channel transistors 540 and 541 onto $Wordline_{00}$ 530 and $Wordline_{0m}$, respectively. Local Voltage Circuit 142 generates $Wordline\ Enable_1$ 531, which feeds into the gate inputs of p-channel transistors 542 and 543 as well as a number of intervening p-channel transistors. Erasing Voltage 400 passes through p-channel transistors 542 and 543 onto $Wordline_{10}$ 522 and $Wordline_{1m}$ 523, respectively. Local Voltage Circuit 146 outputs $Wordline\ Enable_n$ 532, which drives the gate inputs of p-channel transistors 544 and 545, as well as a number of intervening p-channel transistors. Erasing Voltage 400 passes through p-channel transistors 544 and 545 onto $Wordline_{n0}$ 524 and $Wordline_{nm}$ 525, respectively.

The structure illustrated in FIG. 5 operates as follows. When the block select input to one of the local voltage circuits is asserted, the corresponding wordline enable signal emanating from the local voltage circuit is asserted. For example, if $Block\ Select_0$ 510 is asserted, Local Voltage Circuit 140 will drive $Wordline\ Enable_0$ 530 to a voltage which is more negative than Erasing Voltage 400. This will cause Erasing Voltage 400 to pass through p-channel transistor 540 onto $Wordline_{00}$ 520, and through p-channel transistor 541 onto $Wordline_{0m}$ 521.

If, for example, $Block\ Select_1$ 512 feeding into Local Voltage Circuit 142 is not asserted, $Wordline\ Enable_1$ emanating from Local Voltage Circuit 142 assumes a voltage which is less negative than Erasing Voltage 400. This causes a voltage which is less negative than Erasing Voltage 400 and less negative than $Wordline\ Enable_1$ 531 to pass through p-channel transistors 542 and 543 onto $Wordline_{10}$ 522 and $Wordline_{1m}$ 523, respectively. In this way, a non-erasing voltage, which is less negative than Erasing Voltage 400, is applied to the wordlines of $Block_1$ 162.

The invention illustrated in FIG. 5 reduces wordline stress because only the wordlines of selected blocks receive erasing voltages. The wordlines of the unselected blocks will be driven to a less negative non-erasing voltage, thereby greatly diminishing wordline stress on the unselected blocks.

Figure 6:
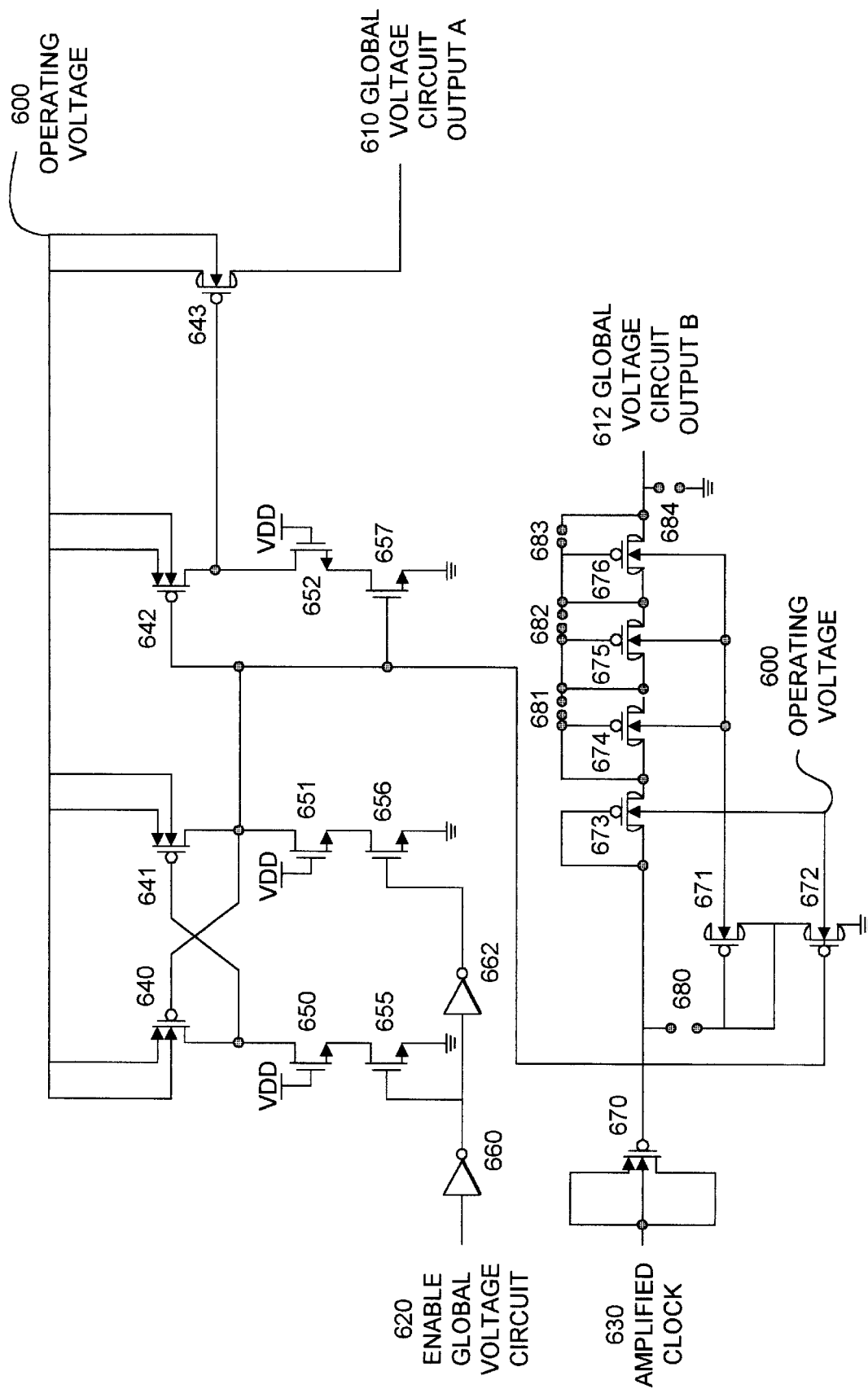
FIG. 6 is a circuit diagram of Global Voltage Circuit 130, excluding the circuitry which implements Erasing Voltage Generator 132, in accordance with an aspect of the present invention.

FIG. 6 is a circuit diagram of a portion of Global Voltage Circuit 130, excluding Erasing Voltage Generator 132, in accordance with an embodiment of the present invention. The circuit in FIG. 6 is the global portion of an enable circuit which is divided between Global Voltage Circuit 130 and a plurality of Local Voltage Circuits 140, 142, 144 and 146. This enable circuit produces a plurality of wordline enable signals, which feed into associated blocks of floating gate memory cells. A wordline enable signal for a particular block connects to the gate inputs of a plurality of p-channel transistors connecting Erasing Voltage 400 to the wordlines of the particular block.

The wordline enable a signal for a selected block is driven more negative than Erasing Voltage 400, allowing Erasing Voltage 400 to be driven onto the wordlines of the selected block.

The wordline enable signals of unselected blocks are driven less negative than Erasing Voltage 400, causing a non-erasing voltage which is less negative than Erasing Voltage 400, to be applied to the gate inputs of the p-channel transistors connecting Erasing Voltage 400 to the wordlines of the unselected blocks, thereby allowing a non-erasing voltage, which is less negative then Erasing Voltage 400, to propagate across the p-channel transistors into the wordlines of the unselected blocks.

The circuit of FIG. 6 takes two inputs: Enable Global Voltage Circuit 620 and Amplified Clock signal 630. It produces two outputs: Global Voltage Circuit Output A 610 and Global Voltage Circuit Output B 612. These global voltage outputs feed into corresponding inputs at each of Local Voltage Circuits 140, 142, 144 and 146.

The circuit illustrated in FIG. 6 is connected as follows. Enable Global Voltage Circuit 620 feeds through inverter 660 into the gate input of n-channel transistor 655. The output of inverter 660 also feeds through inverter 662 into the input of n-channel transistor 656. The drain of n-channel transistor 655 connects to ground, and the source of n-channel transistor 655 connects to the drain of n-channel transistor 650. The gate of n-channel transistor 650 connects to $V_{DD}$, and the source of n-channel transistor 650 connects to the drain of p-channel transistor 640 and the gate input of p-channel transistor 641. The drain of n-channel transistor 656 connects to ground, and the source of n-channel transistor 656 connects to the drain of n-channel transistor 651. The gate input of n-channel transistor 651 connects to $V_{DD}$, and the source of n-channel transistor 651 connects to the gate input of p-channel transistor 640, and the drain of p-channel transistor 641. The source and substrate of both p-channel transistors 640 and 641 connect to Operating Voltage 600.

The source of n-channel transistor 651 further connects to a signal line which connects to the gate input of p-channel transistor 642 and the gate input of n-channel transistor 657. It also connects to the gate input of p-channel transistor 672. The drain of n-channel transistor 657 connects to ground, and the source of n-channel transistor 657 connects to the drain of n-channel transistor 652. The gate input of n-channel transistor 652 connects to $V_{DD}$, and the source of n-channel transistor 652 connects to the drain of p-channel transistor 642 as well as the gate input of p-channel transistor 643. The source and substrate of p-channel transistors 642 and 643 also connect to operating voltage 600. The drain of p-channel transistor 643 connects to Global Voltage Circuit Output A 610. This feeds into a corresponding input in each of Local Voltage Circuits 160, 142, 144 and 146.

Amplified Clock signal 630 feeds into the source, drain and substrate of p-channel transistor 670. The gate input of p-channel transistor 670 feeds into the source of p-channel transistor 671 and the drain and gate input of p-channel transistor 673. It also feeds across connector 680 into the gate input of p-channel transistor 671, the drain of p-channel transistor 671 and the source of p-channel transistor 672. The drain of p-channel transistor 672 connects to ground. The source of p-channel transistor 673 connects to the drain and gate inputs of p-channel transistor 674 as well as into connector 681. Connector 681 further connects into the source of p-channel transistor 674, the drain of p-channel transistor 675 and the gate input of p-channel transistor 675.

The source of p-channel transistor 674 connects to the drain of p-channel transistor 675. The source of p-channel transistor 675 connects to the drain of p-channel transistor 676. The gate input of p-channel transistor 675 feeds across connector 682 into the source of p-channel transistor 675, the drain of p-channel transistor 676 and the gate input of p-channel transistor 676. The source of p-channel transistor 675 connects to the drain of p-channel transistor 676. The gate input of p-channel transistor 676 connects through connector 683 to the source of p-channel transistor 676 as well as across connector 684 to ground. It also connects to Global Voltage Circuit Output B 612, which connects to corresponding inputs in each of Local Voltage Circuits 140, 142, 144 and 146. The substrates of p-channel transistors 671, 672, 673, 674, 675 and 676 all connect to operating voltage 600.

The circuit illustrated in FIG. 6 can be divided into a number of functional units. Inverters 660 and 662 as well as n-channel transistors 650, 651, 652, 655, 656 and 657, and p-channel transistors 640, 641, 642 and 643, form an enabling circuit, which enables portions of a global charge pumps, as well as a plurality of local charge pumps. The local and global charge pumps work together to create wordline enable signals at each block of floating gate memory cells. P-channel transistor 670 functions as an input capacitor to Amplified Clock signal 630, which constitutes part of the global charge pump circuit. P-channel transistors 671 and 672 form a clamp diode for the global charge pump circuit, which clamps the output of capacitor-connected p-channel transistor 671 to a voltage near ground. P-channel transistors 673, 674, 675 and 676 form a chain of diodes connected in series for adjusting the voltage level of Global Voltage Circuit Output B 612, which feeds into an input at each of Local Voltage Circuits 140, 142, 144 and 141.

The circuit of FIG. 6 also includes a number of connectors: 680, 681, 682 and 683, which can be selectively connected for a variety of purposes. Connector 680 can be connected to bypass p-channel transistor 671. This eliminates the clamping function of diode-connected transistor 671. Connectors 681, 682 and 683 can be selectively connected to adjust the voltage feeding into Global Voltage Circuit Output B 612. Finally, connector 684 can be used to tie Global Voltage Circuit Output B 612 to ground.

Figure 7:
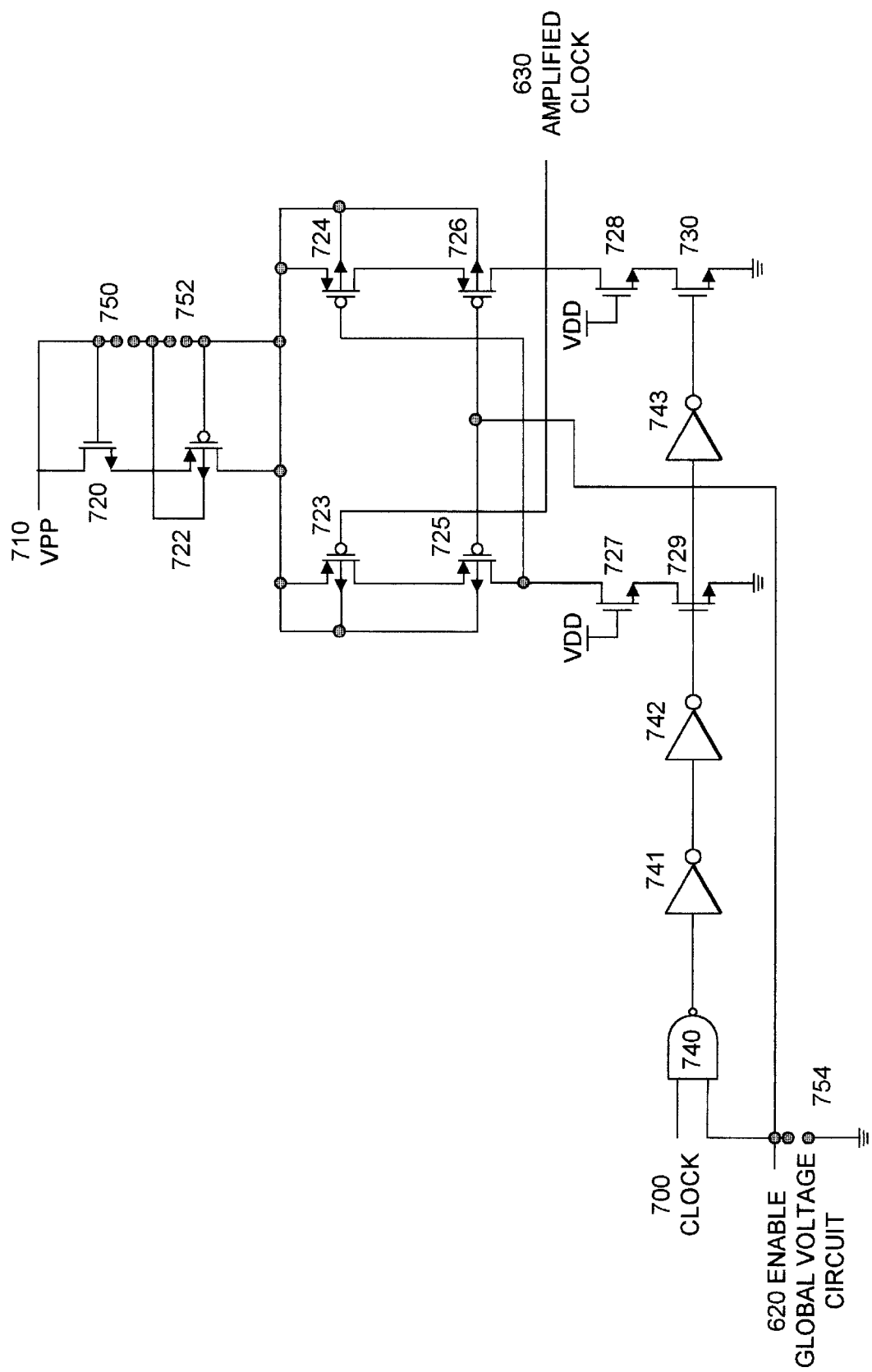
FIG. 7 is a circuit diagram of a portion of Global Voltage Circuit 130, which amplifies Clock signal 700 to produce Amplified Clock signal 630.

FIG. 7 illustrates a portion of Global Voltage Circuit 130 which functions as a "clock driver," creating an Amplified Clock signal 630. The circuit illustrated in FIG. 7 takes in two inputs: Clock signal 700 and Enable Global Voltage Circuit signal 620. It generates a single output, Amplified Clock signal 630.

The circuit FIG. 7 is connected as follows. Clock signal 700 feeds into an input of NAND gate 740, which takes an additional input from Enable Global Voltage Circuit 620. The output of NAND gate 740 feeds through inverters 741 and 742 before arriving at the gate input of n-channel transistor 729. The output of inverter 742 also feeds through inverter 743 into the gate input of n-channel transistor 730. The drains of n-channel transistors 729 and 730 both connect to ground. The source of n-channel transistor 729 connects to the drain of n-channel transistor 727, the gate of which connects to $V_{DD}$, and the source of which connects to the drain of p-channel transistor 725 and the gate input of p-channel transistor 724. The source of n-channel transistor 630 feeds into the drain of n-channel transistor 728, the gate input of which connects to $V_{DD}$, and the source of which connects to the gate input of p-channel transistor 723, the drain of p-channel transistor 726 and Amplified Clock signal 630. Enable Global Voltage Circuit 620 additionally connects to the gate inputs of p-channel transistors 725 and 726. The source of p-channel transistor 725 connects to the drain of p-channel transistor 723. The source of p-channel transistor 723 connects to the drain of p-channel transistor 722, as well as the source of p-channel transistor 724. The source of p-channel transistor 723 additionally connects to the substrates of p-channel transistors 723, 725, 724 and 726. It also connects through connector 752 to the source and substrate of p-channel transistor 722, the drain of n-channel transistor 720 and connector 750. The other side of connector 750 connects into the gate input of n-channel transistor 720 as well as to $V_{PP}$ 710. $V_{PP}$ 710 additionally connects to the source of n-channel transistor 720.

The circuit of FIG. 7 operates as a voltage ladder. It amplifies Clock signal 700 at its input to produce Amplified Clock signal 630 at its output. More specifically, when Enable Global Voltage Circuit signal 620 is at a low voltage, the output of NAND gate 740 is always at a high voltage which will not change regardless of how Clock signal 700 changes. This high voltage feeds through inverters 741 and 742 and appears at the input of n-channel transistor 729. It then feeds through inverter 743 and drives a low voltage into the gate input of n-channel transistor 730. A conducting path is thereby created between the source and drain of n-channel transistor 729, causing the drain of n-channel transistor 727 to assume a low voltage. This puts a low voltage onto the gate input of p-channel transistor 724, which creates a conducting path between Amplified Clock signal 630 and $V_{PP}$ 710. Since Clock signal 700 has no effect on the output of NAND gate 740, Amplified Clock signal 630 remains at this high voltage.

When Enable Global Voltage Circuit signal 620 is at a high voltage, NAND gate 740 essentially functions as an inverter, causing the gate inputs of n-channel transistors 729 and 730 to alternately cycle between high and low voltages. When clock signal 700 is at a low voltage, the gate input of n-channel transistor 729 is at a high voltage and the gate input of n-channel transistor 730 is at a low voltage. This creates a conducting path between the source of n-channel transistor 729 and the drain of n-channel transistor 729, which connects to ground. This results in a low voltage on the gate input of p-channel transistor 724, which creates a conducting path between $V_{PP}$ and Amplified Clock signal 630. When Clock signal 700 is at a high voltage, the input to n-channel transistor 729 is at a low voltage and the gate input to n-channel transistor 730 is at a high voltage. This creates a conducting path between the drain of n-channel transistor 730 and ground. This ties Amplified Clock Signal 630 to ground. In this way, Amplified Clock Signal 630 switches between ground and $V_{PP}$ as clock signal 700 switches between $V_{DD}$ and ground, thereby producing an inverted and amplified clock signal.

Figure 8:
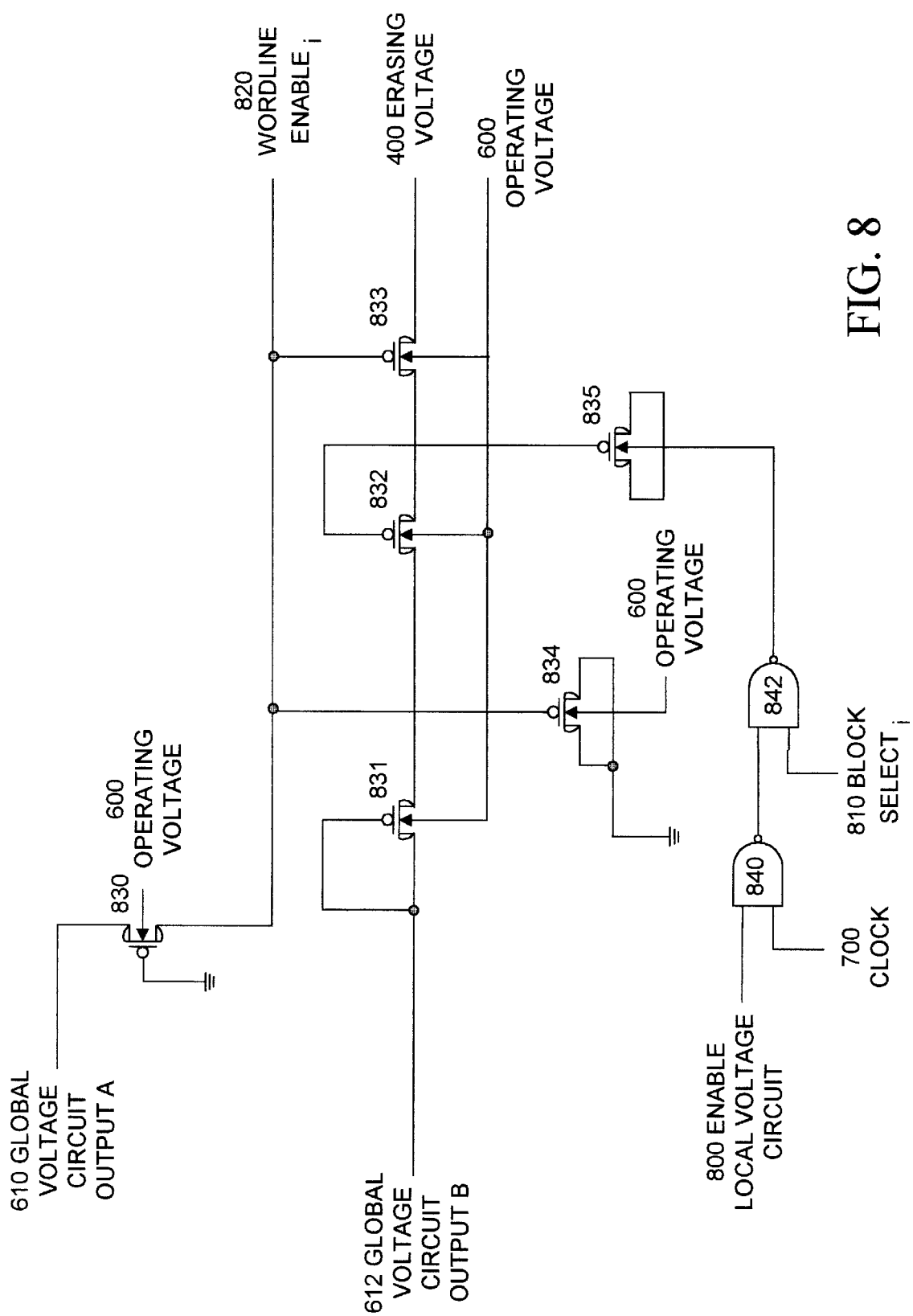
FIG. 8 is a circuit diagram of a Local Voltage Circuit 140 in accordance with an aspect of the present invention.

FIG. 8 is a circuit diagram of a portion of a local voltage circuit, such as in found in Local Voltage Circuits 140, 142, 144 and 146. The circuit in FIG. 8 has a number of inputs, including Global Voltage Circuit Output A 610, Global Voltage Circuit B 612, Enable Local Voltage Circuit 800, Clock signal 700 and Block Select$_i$ 810. It generates Wordline Enable$_i$ 820, which feeds into the gate inputs of a plurality of p-channel transistors through which Erasing Voltage 400 is driven onto the wordlines of the associated block of floating gate memory cells.

The circuit in FIG. 8 is connected as follows. Global Voltage Circuit Output A 610 feeds into the source of p-channel transistor 830, the gate of which is tied to ground and the drain of which connects to Wordline Enable$_i$ signal 820. The drain of p-channel transistor 830 additionally connects to: the gate input of p-channel transistor 833, the source of p-channel transistor 831 the drain p-channel transistor 832, and the gate input of p-channel transistor 834. Global Voltage Circuit Output B connects to both the gate input and drain of p-channel transistor 831. The source of p-channel transistor 831 connects to the drain of p-channel transistor 832. The source and drain of p-channel transistor 832 connect to the drain of p-channel transistor 833 and the gate input of p-channel transistor 835. The source of p-channel transistor 833 connects to Erasing Voltage 400. The source and drain of p-channel transistor 834 connect to ground. The source and drain of p-channel transistor 835 connect to the output of NAND gate 842, the inputs of which connect to Block Select$_i$ 810 and the output of NAND gate 840. NAND gate 840 takes inputs from Enable Local Voltage Circuit signal 800 as well as Clock signal 700. Clock Signal 700 functions as a pump clock inputs for the local enable charge pump. The substrates of p-channel transistors 830, 831, 832, 833 and 834 all connect to Operating Voltage 600.

The circuit in FIG. 8 is divided into a number of functional units. P-channel transistor 831 is connected drain-to-gate as a diode to form a portion of the above-mentioned global voltage pump. The other pieces of this global voltage pump are found in the circuit of FIG. 6. For a detailed disclosure on how negative voltage pumps operate, see U.S. Pat. No. 5,532,960, entitled NEGATIVE VOLTAGE GENERATION FOR FLASH EPROM, by Lin et al., which is hereby incorporated by reference. The source of p-channel transistor 831 is the output of this global voltage charge pump, and p-channel transistor 834 functions as an output capacitor for the global voltage charge pump.

NAND gates 840 and 842, as well as p-channel transistors 835, 832 and 833 function as a local negative voltage charge pump. This local negative voltage charge pump is clamped to Erasing Voltage 400, and operates in concert with the global negative charge pump to pump Wordline Enable$_i$ signal 820 to a voltage which is less negative than Erasing Voltage 400.

The local negative voltage charge pump is enabled by Block Select$_i$ signal 810 as well as Enable Local Voltage Circuit signal 800. When Block Select$_i$ signal 810 is at a low voltage, the output of NAND gate 842, to which Block Select$_i$ signal 810 connects, remains at a high voltage. Consequently, the local voltage charge pump will not receive the required pumping action on its input, and will not create a negative voltage. Similarly, when Enable Local Voltage Circuit signal 800 is at a low voltage, the output of NAND gate 840 will remain at a high voltage and the required switching of the input to the local voltage charge pump will not take place. Consequently, the local voltage charge pump will not operate.

The circuit to generate Wordline Enable$_i$ signal 820 is spread out across FIGS. 6, 7 and 8. It generally operates as follows. The global voltage charge pump, which is distributed between Global Voltage Circuit 130 and each of the Local Voltage Circuits 140, 142, 144 and 146, generates a negative voltage which is less negative than Erasing Voltage 400. This feeds into wordline enable signals for all of the unselected blocks. This allows a non-erasing voltage, which is less negative than Erasing Voltage 400, to be driven onto the wordlines of unselected blocks.

When a block is selected for erasure, the local negative voltage charge pump is activated, and this local voltage charge pump subsequently works in concert with the global voltage charge pump to drive Wordline Enable$_i$ signal 820 to a voltage more negative than Erasing Voltage 400. This more negative voltage allows the plurality of p-channel transistors at each of the blocks of floating gate memory cells to drive Erasing Voltage 400 onto the wordlines of the selected block of floating gate memory cells.

More specifically, the circuit to generate Wordline Enable$_i$ signal 820, operates as follows. When Enable Global Voltage Circuit 620 is asserted, the circuit in FIG. 7 generates Amplified Clock Signal 630 in the manner described previously. Amplified Clock signal 700 feeds into the source and drain of capacitor-connected p-channel transistor 670 in FIG. 6.

When Enable Global Voltage Circuit signal 620 is asserted to a high voltage, the high voltage feeds through inverter 660 to place a low voltage on the gate input of n-channel transistor 655, and then through inverter 662 to place a high voltage on the gate input of n-channel transistor 656. This creates a conducting path between the source and drain of n-channel transistor 656, which ties the drain of n-channel transistor 656 to a ground voltage. Consequently, the drain of n-channel transistor 651 will be ground. This feeds into the gate input of p-channel transistor 672 and creates a conducting path between the source and drain of p-channel transistor 672. This enables the clamping structure of the global voltage pump. The source of n-channel transistor 651 also feeds into the gate input of p-channel transistor 642, and the low voltage creates a conducting path between Operating Voltage 600, at the source of p-channel transistor 642, and the drain of p-channel transistor 642, which connects into the gate input of p-channel transistor 643. This high voltage at the gate input of p-channel transistor 643 isolates Global Voltage Circuit Output A 610, which connects to the drain of p-channel transistor 643, from Operating Voltage 600, at the source of p-channel transistor 643. Global Voltage Circuit Output A signal 610 is therefore left floating.

Amplified Clock signal 630 feeds into capacitor-connected p-channel transistor 670, the gate input of which is clamped through diode-connected p-channel transistor 671 to a ground voltage. When Amplified Clock Signal 630 assumes a high voltage, it charges the capacitor implemented by p-channel transistor 670. When Amplified Clock signal 630 returns to a low voltage, it pushes the voltage at the gate of p-channel transistor 670 to a low negative voltage. Global Voltage Circuit Output B 612 is dragged down to this negative voltage through diode-connected transistors 673, 674, 675 and 676 from FIG. 8, and diode-connected transistor 831 in FIG. 8. The source of p-channel transistor 831 is the output of the global voltage charge pump, which connects to the gate input of capacitor-connected p-channel transistor 834, the source and drain of which connect to ground.

Recall that Global Voltage Circuit Output A 610 is floating, and this floating voltage feeds through p-channel transistor 830 onto Wordline$_i$ 820. Wordline$_i$ 820 further connects to the output of the negative global voltage charge pump at the source of p-channel transistor 831.

When Enable Local Voltage Circuit 800 is enabled to a high voltage, and Block Select$_i$ signal 810 is enabled to a high voltage. Clock signal 700 switches the source and drain of capacitor-connected p-channel transistor 835 between a low and high voltage. When Clock signal 700 is at a high voltage, the capacitor formed by p-channel transistor 835 is charged up. This occurs because the gate input of p-channel transistor 835 is clamped to Erasing Voltage 400 at the source of p-channel transistor 833. When the voltage at the gate input of p-channel transistor 835 attempts to rise above this erasing voltage, the source of p-channel transistor 832 assumes a higher voltage than the drain of p-channel transistor 832, which is connected into the gate input of p-channel transistor 833. The gate input of p-channel transistor 833 is consequently at a lower voltage than the source of p-channel transistor 833, which connects to the gate input of p-channel transistor 835. Consequently, a conducting path is formed between the gate input of p-channel transistor 835 and erasing voltage 400. When Clock signal 700 returns to a low voltage, it pushes the gate input of p-channel transistor 835 down to a low voltage. This causes the source of p-channel transistor 832 to be at a lower voltage than the drain of p-channel transistor 832. This creates conducting path between the source of p-channel transistor 832 and the drain of p-channel transistor 832 which connects to the output of the global voltage pump. Thus, the output of the global voltage pump is driven to a lower voltage than Erasing Voltage 400. When Enable Local Voltage Circuit 800 is disabled and is consequently at a low voltage, the output of NAND gate 840 remains at a high voltage regardless of how Clock signal 700 switches. The local voltage charge pump consequently lacks the pumping action at its input and no additional negative voltage is created at the output of the global voltage charge pump, which connects to Wordline Enable$_i$ 820. Consequently, Wordline Enable$_i$ 820 assumes a voltage which is less negative than as Erasing Voltage 400. This causes a non-erasing negative voltage to be applied to the gate inputs of the plurality of p-channel transistors associated with the block of floating gate memory cells. Wordline stress is thus reduced for these unselected blocks.

The foregoing description of a preferred embodiment of the invention has been presented for the purpose of illustration and description only. It is not intended to be exhaustive or to limit the invention to the precise forms disclosed. Obviously, many modifications and variations will be apparent to practitioners skilled in the art.

What is claimed is:

1. An apparatus for storing data, comprising:
   an array of floating gate memory cells, including a plurality of blocks;
   a set of word lines coupled to the array of floating gate memory cells, the set of word lines including a plurality of subsets coupled to respective blocks in the plurality of blocks;
   a source of a negative voltage;
   a set of pass gates, pass gates in the set of pass gates having control inputs, and being coupled between the source of the negative voltage and corresponding word lines in the set of word lines so that a first voltage is applied to corresponding word line in response to a first control voltage on the control input and to the negative voltage, and a second voltage is applied to the corresponding word line in response to a second control voltage on the control input and to the negative voltage;
   a block selector circuit to determine at least one selected block and at least one unselected block;
   a control circuit coupled to the block selector circuit, which supplies the first control voltage to the pass gates in the set of pass gates coupled to the subset of word lines in the at least one selected block and the second control voltage to the pass gates in the set of pass gates coupled to the subset of word lines in the at least one unselected block.

2. The apparatus of claim 1, wherein the first control voltage is more negative than the negative voltage, and the second control voltage is less negative than the negative voltage.

3. The apparatus of claim 2, wherein the first voltage is about equal to the negative voltage, and the second voltage is less negative than the negative voltage.

4. The apparatus of claim 1, wherein pass gates in the set of pass gates comprise p-channel transistors, having respective gates, sources and drains, and wherein the control inputs comprise the gates of the p-channel transistors, and one of the sources and drains coupled to the source of negative voltage and the other of the sources and drains coupled to the corresponding word line.

5. The apparatus of claim 1, wherein the control circuit includes a global component and a plurality of local components, the global component providing a source of power at a global component output for producing the second control voltage at the plurality of local components, the local components in the plurality of local components coupled corresponding subsets of word lines, to the global component output, and to the source of negative voltage, and including circuitry responsive to the block selector for producing the second control voltage in response to the source of power if the corresponding block is unselected, and for producing the first control voltage in response to the source of negative voltage if the corresponding block is selected.

6. The apparatus of claim 5, wherein the global component comprises a clock input, an input capacitor connected between the clock input and the global component output, and a clamp circuit coupled between the global component output and a reference potential, and the local components in the plurality of local components include respective diodes coupled between the global component output and the corresponding word lines, and respective charge holding capacitors coupled between the corresponding word lines and a reference potential; and respective charge pump circuits, coupled between the source of negative voltage and the corresponding word lines, and having pump clock inputs, and logic responsive to the block selector which enables a pump clock signal on the pump clock input if the corresponding block is selected, and disables a pump clock signal on the pump clock input if the corresponding block is unselected.

7. The apparatus of claim 1, wherein the source of negative voltage comprises a charge pump circuit, and wherein the array, the charge pump circuit, the set of word lines, the set of pass gates, the block selector and the control circuit comprise elements of a single integrated circuit.

8. The apparatus of claim 7, wherein the control circuit includes a global component and a plurality of local components, the global component, coupled to a source of positive voltage, and providing a source of power at a global component output for producing the second control voltage at the plurality of local components, the local components in the plurality of local components coupled to corresponding subsets of word lines, to the global component output, and to the source of negative voltage, and including circuitry responsive to the block selector for producing the second control voltage in response to the source of power if the corresponding block is unselected, and for producing the first control voltage in response to the source of negative voltage if the corresponding block is selected.

9. The apparatus of claim 8, wherein the global component comprises a clock driver coupled to the source of positive voltage to drive a clock signal, clock input coupled to the clock driver to receive the clock signal, an input capacitor connected between the clock input and the global component output, and a clamp circuit coupled between the global component output and a reference potential, and the local components in the plurality of local components include respective diodes coupled between the global component output and the corresponding word lines, and respective charge holding capacitors coupled between the corresponding word lines and a reference potential; and respective charge pump circuits, coupled between the source of negative voltage and the corresponding word lines, and having pump clock inputs, and logic responsive to the block selector which enables a pump clock signal on the pump clock input if the corresponding block is selected, and disables a pump clock signal on the pump clock input if the corresponding block is unselected.

10. The apparatus of claim 8, wherein the integrated circuit comprises a first supply terminal for a first supply voltage, and a second supply terminal for a second supply voltage higher than the first supply voltage, and the source of positive voltage comprises the second supply terminal.

11. An apparatus for storing data, comprising:

a plurality of blocks of floating gate memory cells;

a plurality of wordlines divided into a plurality of subsets, subsets in the plurality of subsets coupled to associated blocks in the plurality of blocks;

a source of a negative erase potential;

a plurality of pass gates coupled to respective wordlines in the plurality of wordlines, and to the source of a negative erase potential, the plurality of pass gates having respective gate terminals;

a voltage circuit coupled to the gate terminals of the plurality of pass gates providing an erase enabling voltage having a voltage more negative than the negative erase potential and an erase disabling voltage having a voltage less negative than the negative erase potential but less than zero volts, to the gate terminals of the plurality of pass gates to drive an erasing voltage and a non-erasing voltage respectively onto the corresponding wordlines; and a block selector circuit for determining at least one selected block and at least one unselected block from the plurality of blocks, the block selector circuit being coupled to and selectively enabling the voltage circuit to drive the erasing voltage onto the subset of wordlines coupled to the at least one selected block, and the non-erasing voltage onto the subset of wordlines coupled to the at least one unselected block.

12. The apparatus of claim 11, wherein the voltage circuit includes a global voltage circuit and a plurality of local voltage circuits, the global voltage circuit being coupled to the plurality of local voltage circuits, and the plurality of local voltage circuits being coupled to the pass gates coupled to the subsets of wordlines of associated blocks in the plurality of blocks, the block selector circuit being coupled to and selectively enabling the local voltage circuits.

13. The apparatus of claim 12, wherein the plurality of pass gates comprises a plurality of p-channel transistors coupled to respective wordlines in the subset of wordlines of the associated block, such that the erasing voltage and the non-erasing voltage are applied to the respective wordlines through the plurality of p-channel transistors.

14. The apparatus of claim 13, further including:

a global enable charge pump distributed between the global voltage circuit and the plurality of local voltage circuits, the global enable charge pump generating a voltage less negative than the erasing voltage;

a plurality of local enable charge pumps within associated local voltage circuits from the plurality of local voltage circuits, the plurality of local enable charge pumps being coupled to and enabled by the block selector circuit, and being coupled to and clamped to the negative erase potential to create a voltage more negative than the negative erase potential.

15. The apparatus of claim 14, wherein the global enable charge pump includes an input capacitor, a clamp diode, a plurality of output diodes and a plurality of output capacitors, the global enable charge pump being divided between the global voltage circuit and the plurality of local voltage circuits, so that:

the global voltage circuit includes the input capacitor and the clamp diode; and the plurality of local voltage circuits include the plurality of output diodes and the plurality of output capacitors.

16. The apparatus of claim 11, wherein the source of a negative erase potential comprises an erasing voltage charge pump.

17. An array of floating gate memory cells, comprising:

a plurality of blocks of floating gate memory cells;

a plurality of wordlines divided into a plurality of subsets, subsets in the plurality of subsets being coupled to associated blocks in the plurality of blocks;

a block selector circuit for determining at least one selected block and at least one unselected block from the plurality of blocks;

an erasing voltage charge pump which generates an erasing voltage;

a global voltage circuit;

a plurality of local voltage circuits coupled to the global voltage circuit, including a plurality of p-channel transistors coupled to the erasing voltage charge pump and the subsets of wordlines of associated blocks in the plurality of blocks;

a global enable charge pump including an input capacitor, a clamp diode, a plurality of output diodes and a plurality of output capacitors, the global enable charge pump being divided between the global voltage circuit and the plurality of local voltage circuits, so that the global voltage circuit includes the input capacitor and the clamp diode, and the plurality of local voltage circuits include the plurality of output diodes and the plurality of output capacitors;

a plurality of local enable charge pumps within associated local voltage circuits from the plurality of local voltage circuits, the plurality of local enable charge pumps being coupled to and enabled by the block selector circuit, and being coupled to and clamped to the erasing voltage charge pump; and a plurality of wordline enable signals coupled to the plurality of local enable charge pumps and to the global enable charge pump, the plurality of wordline enable signals feeding into the gate inputs of the plurality p-channel transistors coupled to the subsets of wordlines of associated blocks in the plurality of blocks, such that:

when a local enable charge pump from the plurality of local enable charge pumps is enabled, the associated wordline enable is driven by the local enable charge pump, causing the wordline enable feeding into the gate inputs of the plurality of p-channel transistors coupled to the associated subset of wordlines to be more negative than the erasing voltage, allowing the erasing voltage to pass through the plurality of p-channel transistors into the plurality of wordlines; and when a local enable charge pump from the plurality of local enable charge pumps is not enabled, the associated wordline enable is driven by the global enable charge pump, causing the wordline enable feeding into the gate inputs of the plurality of p-channel transistors coupled to the associated subset of wordlines to be less negative than the erasing voltage, allowing a non-erasing voltage, which is less negative than the erasing voltage, to pass through the plurality of p-channel transistors into the plurality of wordlines.

* * * * *